United States Patent [19]
Kang

[11] Patent Number: 5,410,262
[45] Date of Patent: Apr. 25, 1995

[54] DATA OUTPUT BUFFER OF A SEMICONDUCTOR INTEGRATED CIRCUIT

[75] Inventor: Kyung-Woo Kang, Kyungki-do, Rep. of Korea

[73] Assignee: Samsung Electronics Co., Ltd., Suwon, Rep. of Korea

[21] Appl. No.: 255,780

[22] Filed: Jun. 8, 1994

[30] Foreign Application Priority Data

Jun. 8, 1993 [KR] Rep. of Korea ............ 1993-10316

[51] Int. Cl.$^6$ .............................................. H03K 3/09
[52] U.S. Cl. .................................... 327/108; 327/170; 327/379; 326/21
[58] Field of Search ............... 307/263, 270, 572, 273, 307/443, 542, 542.1, 549, 550

[56] References Cited

U.S. PATENT DOCUMENTS

| | | | |
|---|---|---|---|
| 4,928,023 | 5/1990 | Marshall | 307/270 |
| 5,122,690 | 6/1992 | Bianchi | 307/443 |
| 5,166,555 | 11/1992 | Kano | 307/443 |

*Primary Examiner*—Timothy P. Callahan
*Assistant Examiner*—Jung Ho Kim
*Attorney, Agent, or Firm*—Charles R. Donohoe; Robert A. Westerlund, Jr.; Stephen R. Whitt

[57] ABSTRACT

A data output buffer of a semiconductor integrated circuit is operable in response to data input to data lines and comprises a first pull-down control circuit which generates a first pull-down signal in response to the data input to the data lines. A second pull-down control circuit generates a second pull-down signal in response to the data input to the data lines, the second pull-down signal being generated at a predetermined time after the first pull-down signal is generated and causing the first pull down signal to be deactivated. A first pull-down transistor shares an output node with a pull-up transistor and is responsive to the first pull-down signal to pull-down a predetermined amount of voltage at the output node. A second pull-down transistor is responsive to the second pull down signal for pulling down a residual amount of voltage at the output node.

11 Claims, 3 Drawing Sheets

DATA OUTPUT BUFFER OF A SEMICONDUCTOR INTEGRATED CIRCUIT

Priority rights are based on Korean Application No. 10316/1993 filed Jun. 8, 1993, which Korean Application is hereby incorporated by reference.

BACKGROUND OF THE INVENTION

The present invention relates to a semiconductor integrated circuit, and more particularly to a data output buffer for outputting data read from a cell array to circuitry externally to a chip.

As the density of a semiconductor integrated circuit becomes higher and the operating speed thereof increases, noise reduction becomes a more critical factor. There are many reasons that cause the semiconductor integrated circuit to generate noise. Most significantly, noise is generated at an output stage of a data output buffer (this is commonly known as a "data output driver") when the data read from a memory cell passes through an input/output line sense amplifier formed on a data input/output line and then travels externally to the chip. Since a transistor constituting the output stage of the data output buffer functions to buffer internal and external impedance, and has a large size channel in comparison with those of other components within the chip in order to access data at a high speed, a great amount of current flows instantaneously when a data output operation is performed (at this moment, a transition is made from the "high" level to the "low" level, or from the "low" level to the "high" level). As a result, ground noise is generated at the circuits which are supplied with a ground voltage as a power supply voltage on the same chip.

FIG. 1 shows a conventional data output buffer which is well known in the art. In FIG. 1, DO and $\overline{DO}$ represent data inputs read from a memory cell, and CLK represents a clock signal for enabling a pull-up and pull-down controller 100 of the data output buffer. Further, PU and PD output from the pull-up and pull-down controller 100 are applied respectively to pull-up and pull-down transistors 2 and 4 constituting the output stage of the data output buffer, to transfer the data output DOUT of the data output buffer to a data output pad (PAD or PIN: not shown). The components of the pull-up and pull-down controller 100 are not shown in FIG. 1 because the construction thereof is well known in the art.

The operation of FIG. 1 will be explained with reference to FIG. 2, showing an operational timing diagram thereof. First, the operation in which the data output DOUT of the "high" level is output will be explained. When an output operation of the data output buffer is disabled, the signals PU and PD are all at the "low" level, thereby causing the pull-up and pull-down transistors 2 and 4 to be turned off. In the meantime, if an external address changes to generate a data output DOUT of a "high" level, and the clock signal CLK goes to an activate "high" state, the pull-up and pull-down controller 100 is enabled, and the pull-up transistor 2 is turned on by the signals PU and PD respectively set to the "high" level and the "low" level according to the data inputs DO and $\overline{DO}$. As a result, the voltage at an output node 6 goes to the "high" level. Thus, the data output DOUT of the "high" level is output, and a large amount of current flows instantaneously from a power supply voltage Vcc into a channel of the pull-up transistor 2.

Next, the operation in which the data DOUT of the "low" level is output will be explained. If the external address changes to generate the data output DOUT of the "low" level and the signal CLK goes to the active "high" state, the pull-up and pull down controller 100 is enabled. Thus, the pull-down transistor 4 is turned on by the signals PU and PD set respectively to the "low" level and the "high" level according to the data inputs DO and $\overline{DO}$, thereby causing a voltage at an output node 6 to be discharged to the ground voltage Vss through a channel of the pull-down transistor 4. Therefore, the data output DOUT of the "low" level is output. At this moment, a large amount of the current flows instantaneously through the channel of the pull down transistor 4, generating the ground noises as shown in FIG. 2.

The ground noises generated by the current flowing into the ground line Vss causes error data at the output node 6 as shown in FIG. 2, resulting in a faulty operation of the system. Such undesirable operation is preformed through the large channel of the pull-down transistor 4 whenever the circuit outputs the "low" state, so that the operating speed of the chip is lowered and the chip performs the incorrect operation. This problem becomes serious in the high density semiconductor integrated circuit having a large number of the data output buffers within one chip such as a byte wide integrated circuit. Further, as the load of the output stage of the data output buffer become larger, the time required for a data transition is delayed longer.

In order to solve this problem, the data output buffer having a preset circuit formed in the output stage is disclosed in Korean Patent Application No. 1991-24802 filed on 28 Dec. 1991 by the same applicant, and hereby incorporated by reference. Here, the ground noises are removed by presetting an output line of the data output buffer with a predetermined voltage during the data output operation. However, such device is disadvantageous in that a number of data output buffers each should include (on the same chip) the preset circuits, according to the bit-wide memory trends of recently developed semiconductor integrated circuits. Since the preset circuit included in each data output buffer needs a control signal, it should have an extra circuit for generating the control signal. In this arrangement, the area occupied by the preset circuit on the chip is rather large. This is disadvantageous for the high density of the very large scale integrated circuit. In addition, under such circuit construction, the ground noises are not satisfactorily prevented from being generated at the ground line when the data output at the "low" level is output.

SUMMARY OF THE INVENTION

It is therefore an object of the present invention to provide a data output buffer for protecting an output node from ground noises generated during a data output operation.

It is another object of the present invention to provide a data output buffer for preventing error data being output due to ground noises generated when data of the "low" level is output.

It is still another object of the present invention to provide a data output buffer for reducing ground noises by performing a second pull-down operation for maintaining a voltage at an output node previously pulleddown during a first pull-down operation, when data set to the "low" level is output.

According to one aspect of the present invention, a data output buffer of a semiconductor integrated circuit connected to a pair of data input/output lines for receiving data read from a memory cell array includes, first pull-down control means for providing a first pull-down signal in response to a voltage level of the data on the data input/output lines. Also provided is a second pull down control means for providing a pull-down signal which is activated, with a predetermined time delay, in response to the voltage level of the data. The first pull-down signal is discontinued when the second pull-down signal is activated. A first pull-down transistor is provided for initially pulling down a predetermined amount of voltage at an output node in response to the first pull down signal. A second pull-down transistor then pulls down residual voltage at the output node in response to the second pull-down signal. A resistance is preferably formed between the second pull-down transistor and a ground line.

The second pull-down control means comprises a delay circuit disposed on a path for providing the second pull-down signal delayed from the voltage level of the data input.

The data output buffer according to the present invention outputs data set at the "low" level by making the voltage at the output node with a pull-down state through the first pull-down operation when the data set to the "low" level is output. According to the present invention, in the data output buffer, data of the "low" state is output by making the voltage at the output node with a pull-down state through the first pull-down operation and the data of the "low" state is protected and maintained by the second pull-down operation performed successively.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

The term "data output buffer" used in the present specification refers to a circuit which reads data from a memory cell and outputs data externally to the chip, and includes a data output driver. The term "two step pull-down operation" means that the data output buffer is successively operated in two steps when data at the "low" level is output. The two step pull-down operation effectively maintains the "low" level of the output data.

Figure 1:
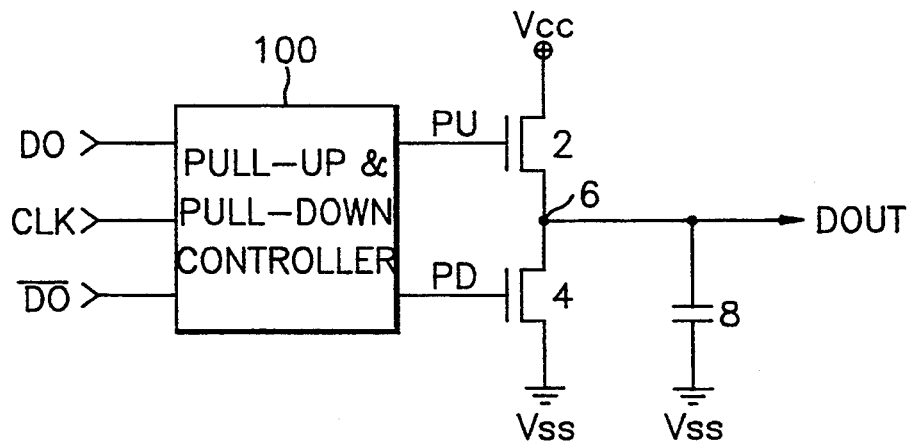
FIG. 1 is a circuit diagram showing a data output buffer according to the prior art.
Figure 2:
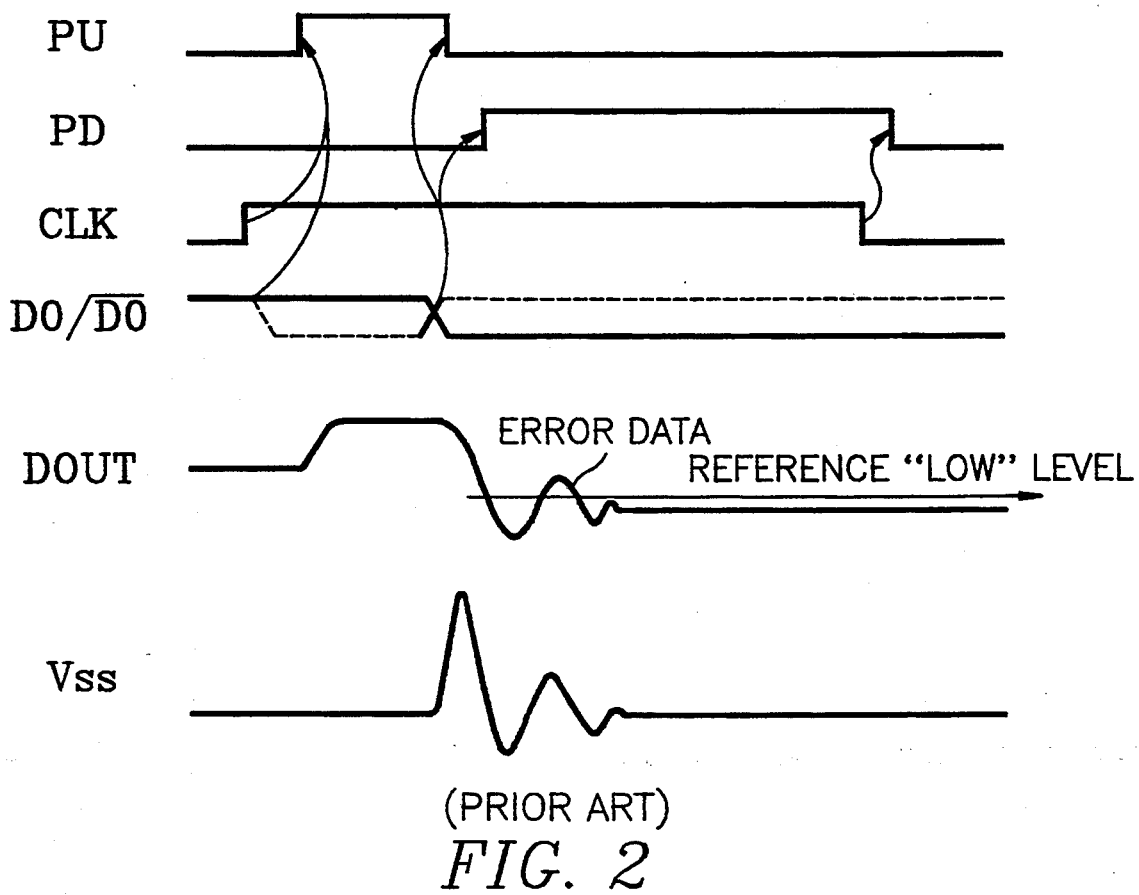
FIG. 2 is an operational timing diagram showing voltage waveforms of FIG. 1 during a data output operation.
Figure 3:
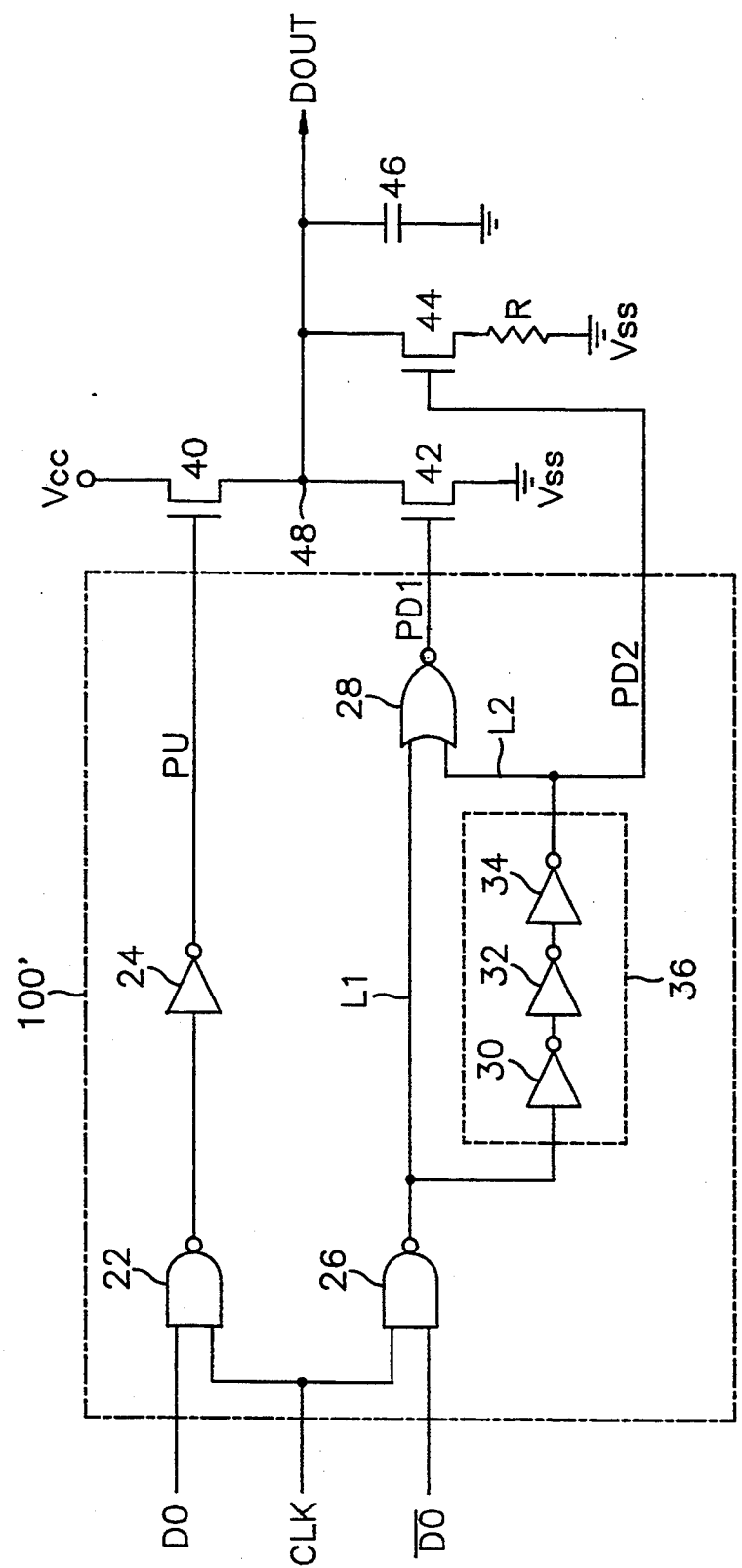
FIG. 3 is a circuit diagram showing a data output buffer according to the present invention.

FIG. 3 is a circuit diagram showing a data output buffer according to the present invention. In construction, a data input DO read from a memory cell array and transferred through a data input/output line and an enable signal CLK of the data output buffer are applied to a NAND gate 22 and an inverter 24 is connected to an output of the NAND gate 22. A signal output from the inverter 24 serves as a control signal PU of a pull-up transistor 40. A data input $\overline{DO}$ read from the cell array and transferred through the data input/output line, and the enable signal CLK of the data output buffer are applied to a NAND gate 26. A signal output from the NAND gate 26 is applied commonly to a delay circuit 36 and a NOR gate 28. The delay circuit 36 is comprised of inverters 30, 32, and 34 of which inputs and outputs are serially connected to each other. The output signal of the inverter 34 is input to the NOR gate 28. The signal output from the NOR gate 28 serves as a first pull-down signal PD1 which becomes a control signal of a first pull-down transistor 42. The signal output of the delay circuit 36 serves as a second pull-down signal PD2, which becomes a control signal of a second pull-down transistor 44. In such configuration, the NAND gate 26 and NOR gate 28 function as first pull-down control means (or "control circuit") and the NAND gate 26 and the delay circuit 36 function as second pull-down control means (or "control circuit"). Preferably, a capacitor 46 is connected between the output node DOUT and ground.

In the construction of FIG. 3, a pull-up and pull-down controller 100' is shown in a dot-and-dash line block. The control signal CLK for driving the pull-up and pull-down controller 100' can be readily made by using a signal PITRST, as disclosed in Korean Patent application No. 1993-5328 filed on 31 Mar. 1993 by the same applicant, and hereby incorporated by reference.

Figure 4:
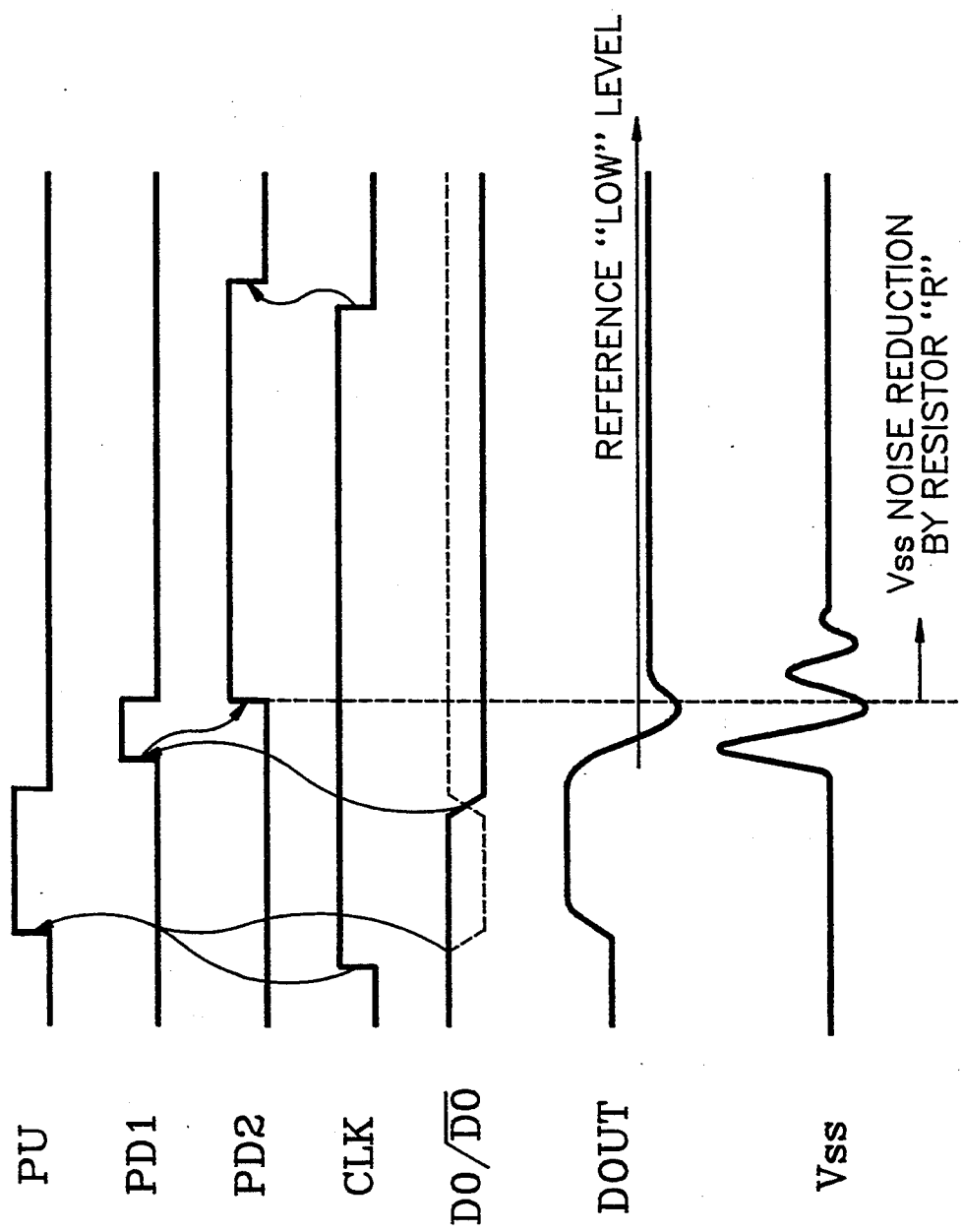
FIG. 4 is an operational timing diagram showing voltage waveforms of FIG. 3 during a data output operation.

The operational characteristic of the data output buffer will be explained with reference to FIG. 4 showing an operation timing diagram of FIG. 3. The operational timing diagram illustrates that the level of the data output DOUT changes to the "low" level from the "high" level. The present invention enables data to be output through a two step pull-down operation when the data of the "low" level is output. More specifically, the NAND gates 22 and 26 each output the data of the "high" level before the signal CLK of the data output buffer is enabled to the "high" level. Then, the delay circuit 36 outputs the "low" level. The signals PU, PD1 and PD2 are respectively kept at the "low" level, as shown in FIG. 4. At this moment, the pull-up transistor 40, and the first and second pull-down transistors 42 and 44 are all turned off. Under this condition, the data inputs DO and $\overline{DO}$ are input. If the signal CLK of the data output buffer changes to the "high" level, the NAND gates 22 and 26 are enabled and the respective output levels are determined by the data inputs DO and $\overline{DO}$. When the data inputs DO and $\overline{DO}$ are respectively at the "high" level and the "low" level to output the data output DOUT of the "high" level, the signals PD1 and PD2 are kept at the "low" level and only the signal PU is set to the "high" state. Then, the pull-up transistor 40 is turned on and the first and second pull-down transistors 42 and 44 are both turned off, so that the data output DOUT of the "high" level is output.

In contrast, when the data inputs DO and $\overline{DO}$ are respectively at the "low" level and the "high" level, the NAND gate 22 outputs the "high" state and the NAND gate 26 outputs the "low" level. Then, the signal PU of the "low" level is generated through the inverter 24 and the pull-up transistor 40 is turned off. Further, a line L1 becomes "low" through the output signal of the NAND gate 26. At this moment, the NOR gate 28 outputs the "high" level, since a line L2 was previously kept at the "low" level. Here, the time for keeping the signal PD1 at the "low" level is important. That is, the time for keeping the signal PD1 at the "high" level is determined by the number of inverters included in the delay circuit 36. Therefore, the time can be adequately adjusted according to the size of a transistor having the data output buffer and the level of the power supply voltage. At the same time, the number of inverters included in the delay circuit 36 is properly determined according to the above-mentioned facts (there are three inverters in FIG. 3). On the other hand, the signal L2 set to the "low" level is changed to the "high" level after a signal L1 set to the "low" level passes through the three inverters 30, 32 and 34. Accordingly, the NOR gate 28 outputs the "low" level and the signal PD2 becomes "high" with a specific time delay, as shown in FIG. 4. Therefore, the second pull-down transistor 44 is turned on when the first pull-down transistor 42 is turned off, so that the first pull-down transistor 42 performs the momentary turn-on operation while the signal PD1 is kept at the "high" level. Further, the voltage at the output node 48 is dropped sufficiently to the "low" level. (At this moment, ground noises may be generated at the ground line. However, the ground noises cannot pass through the channel of the first pull-down transistor 42 because of the turning-off operation thereof. Then, the second pull-down transistor 44 is turned on by the signal PD2 of the "high" level, thereby successively discharging the voltage level at the output node 48 to the ground line Vss. Therefore, the output node 48 is protected from the generation of the ground noises by disposing a resistor R between the first pull-down transistor 44 and the ground Vss. As mentioned above, the data output buffer protects the output node 48 from the generation of the ground noises by the two step pull-down operation when the data output buffer operates according to the present invention. As a result, error data is not output in the embodiment of the present invention.

The data output buffer shown in FIG. 3 is a preferred embodiment of the present invention. However, it can be appreciated that other configurations are possible, and are contemplated by the invention. For example, the number of inverters included in the delay circuit 36 can be varied in accordance with the channel size of the transistors used for the inverters and D the level of the power supply voltage. In addition, while the output driver having the output line of the data output buffer includes pull-up and pull-down transistors 40 and 42, which both comprise an NMOS transistor, the pull-up transistor can be replaced with a PMOS transistor. In this case, the signal PU should be inverted.

As mentioned above, the data output buffer of the present invention performs a two step pull-down operation. The first step maintains the voltage at the output line at the "low" level during the data output operation. The second step requires more time than the first step and occurs after the first step. As a result, the output node is protected from the ground noises generated during the first pull-down operation in the ground line Vss, and the two step pull-down operation permits the data output buffer to be discharged without generating error data. More particularly, the ground noises are maximally reduced by the data output buffer preforming the two step operation. Further, the extra preset circuit is not necessary and the integration of the chip is more simplified. Further, the output node is stably protected from the ground noises generated at the ground line when the "low" level is output, thereby preventing the error data from being output.

It thus will be seen that the objects of this invention have been fully and effectively accomplished. It will be realized, however, that the foregoing preferred specific embodiment has been shown and described for the purpose of this invention and is subject to change without departure from such principles. Therefore, this invention includes all modifications encompassed within the spirit and scope of the following claims.

What is claimed is:

1. A data output buffer of a semiconductor integrated circuit operable in response to data input to data lines and connected between a power supply line and a ground line, comprising:
   a first pull-down control circuit for generating a first pull-down signal in response to said data input to said data lines;
   a second pull-down control circuit for generating a second pull-down signal in response to said data input to said data lines, said second pull-down signal being generated at a predetermined time after said first pull-down signal is generated and causing said first pull down signal to be deactivated;
   a pull-up transistor;
   a first pull-down transistor sharing an output node with said pull-up transistor and being responsive to said first pull-down signal for pulling-down a predetermined amount of voltage at said output node; and
   a second pull-down transistor responsive to said second pull down signal for pulling down a residual amount of voltage at the output node.

2. A data output buffer as claimed in claim 1, wherein said second pull-down control circuit comprises a delay circuit having at least three inverters connected in series to one another.

3. A data output buffer as claimed in claim 2, wherein said delay circuit further comprises a nand gate.

4. A data output buffer as claimed in claim 3, wherein said first pull-down control circuit comprises said nand gate and a nor gate.

5. A data output buffer as claimed in claim 1, further comprising clock input means for receiving an input clock signal to drive said data output buffer.

6. A data output buffer as claimed in claim 1, further comprising a resistance disposed between said second pull-down transistor and said ground line.

7. A data output buffer as claimed in claim 1, further comprising a capacitor connected between the output node and the ground line.

8. A data output buffer of a semiconductor integrated circuit connected to a pair of data lines for receiving data read from a memory cell array and connected between a power supply line and a ground line, comprising:
   a first pull-down control circuit for generating a first pull-down signal in response to data input to said data lines;
   a second pull-down control circuit for generating a second pull-down signal in response to said data input to said data lines, said second pull-down signal being generated at a predetermined time after said first pull-down signal is generated and causing said first pull down signal to be deactivated;
   a first pull-down transistor responsive to said first pull-down signal for pulling-down a predetermined amount of voltage at an output node;

a second pull-down transistor responsive to said second pull down signal for pulling down a residual amount of voltage at the output node; and a resistance disposed between said second pull-down transistor and said ground line.

9. A data output buffer as claimed in claim 8, wherein said second pull-down control circuit comprises a delay circuit including a plurality of inverters for delaying generation of said second pull-down signal.

10. A data output buffer as claimed in claim 9, further comprising a pull-up transistor sharing the output node with said first pull-down transistor.

11. A data output buffer of a semiconductor integrated circuit connected to a pair of data lines for receiving data read from a memory cell array and connected between a power supply line and a ground line, comprising:

a first pull-down control circuit for generating a first pull-down signal in response to data input to said data lines;

a second pull-down control circuit for generating a second pull-down signal in response to said data input to said data lines, said second pull-down signal being generated at a predetermined time after said first pull-down signal is generated and causing said first pull down signal to be deactivated;

a pull-up transistor;

a first pull-down transistor sharing an output node with said first pull-up transistor and being responsive to said first pull-down signal for pulling-down a predetermined amount of voltage at the output node;

a second pull-down transistor responsive to said second pull down signal for pulling down a residual amount of voltage at the output node; and a resistance disposed between said second pull-down transistor and said ground line.

* * * * *